(12) United States Patent
Miyazaki

(10) Patent No.: US 7,757,199 B2
(45) Date of Patent: Jul. 13, 2010

(54) LOGIC DESCRIPTION LIBRARY OF DIFFERENTIAL INPUT CIRCUIT

(75) Inventor: Hiroshi Miyazaki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 123 days.

(21) Appl. No.: 10/986,146

(22) Filed: Nov. 12, 2004

(65) Prior Publication Data

US 2006/0025979 A1  Feb. 2, 2006

(30) Foreign Application Priority Data

Jul. 30, 2004  (JP)  ............... 2004-224451

(51) Int. Cl.
  *G06F 17/50* (2006.01)
(52) U.S. Cl. .................. 716/17; 716/3; 716/5
(58) Field of Classification Search ............... 716/1, 716/3, 17, 5; 703/14
   See application file for complete search history.

(56) References Cited

U.S. PATENT DOCUMENTS

| 4,671,391 | A | * | 6/1987 | Sasao | ................. | 187/394 |
| 4,906,862 | A | * | 3/1990 | Itano et al. | ............. | 365/185.17 |
| 5,940,448 | A | * | 8/1999 | Kuo | ................. | 375/316 |
| 7,003,420 | B2 | * | 2/2006 | Ur et al. | ................. | 702/117 |
| 2002/0172159 | A1 | * | 11/2002 | Koenig et al. | ............... | 370/241 |

FOREIGN PATENT DOCUMENTS

| JP | 6-58996 | 3/1994 |
| JP | 7-152815 | 6/1995 |
| JP | 10-69504 | 3/1998 |
| JP | 10-336007 | 12/1998 |
| JP | 2000-261309 | 9/2000 |

OTHER PUBLICATIONS

Elanix Inc., "A Guide to the Logic Library," by Elanix Inc., 2001, pp. 1-76.*
"Differential Input Model Examples", TetraMAX On-Line Help V-2004.06, May 25, 2006.
Communication issued from the Japanese Patent Office on Oct. 20, 2009 in the related Japanese patent application No. 2004-224451.
Communication issued from the Japanese Patent Office on Feb. 24, 2010 in the related Japanese patent application No. 2004-224451.

* cited by examiner

*Primary Examiner*—Vuthe Siek
(74) *Attorney, Agent, or Firm*—Staas & Halsey LLP

(57) ABSTRACT

To present a logic description library of differential input circuit capable of expressing logically, in a differential input circuit, by including an input and output response characteristic depending on the voltage level of individual differential input signals in addition to an input and output response characteristic depending on the differential voltage between differential input signals. A logic description library 1*a* includes first detection logic primitive DPR1 and output control logic primitive OPR. A tristate buffer TBF functions as a buffer when first detection signal IS1 is at low level, and is controlled in a floating state when first detection signal IS1 is at high level. When at least either positive side logic input signal DINP or negative side logic input signal DINM is at undefined level, the first detection signal IS1 issued from inverter INV3 is at undefined level. Hence, output expectation value DOUT issued from output control logic primitive OPR is at undefined level.

16 Claims, 8 Drawing Sheets

LOGIC DESCRIPTION LIBRARY 1a IN FIRST PREFERRED EMBODIMENT

TRUTH TABLE

| DINP | DINM | DOUT |
|------|------|------|
| 0 | 0 | L |
| 0 | 1 | L |
| 1 | 0 | H |
| 1 | 1 | H |
| X | 0 | X |
| X | 1 | X |
| 0 | X | X |
| 1 | X | X |
| X | X | X |

LOGIC DESCRIPTION LIBRARY 1a IN FIRST PREFERRED EMBODIMENT

TRUTH TABLE OF FIG. 1

| DINP | DINM | DOUT |
|------|------|------|
| 0    | 0    | L    |
| 0    | 1    | L    |
| 1    | 0    | H    |
| 1    | 1    | H    |
| X    | 0    | X    |
| X    | 1    | X    |
| 0    | X    | X    |
| 1    | X    | X    |
| X    | X    | X    |

DIAGRAM SHOWING VOLTAGE APPLICATION METHOD WHEN TESTING DIFFERENTIAL INPUT CIRCUIT IN THE INVENTION

LOGIC DESCRIPTION LIBRARY 1b IN SECOND PREFERRED EMBODIMENT

TRUTH TABLE OF FIGS. 4 AND 12

| DINP | DINM | DOUT |
|------|------|------|
| 0 | 0 | H |
| 0 | 1 | L |
| 1 | 0 | H |
| 1 | 1 | H |
| X | 0 | X |
| X | 1 | X |
| 0 | X | X |
| 1 | X | X |
| X | X | X |

LOGIC DESCRIPTION LIBRARY 1c IN THIRD PREFERRED EMBODIMENT

TRUTH TABLE OF FIG. 6

| DINP | DINM | DOUT |
|------|------|------|
| 0 | 0 | L |
| 0 | 1 | L |
| 1 | 0 | H |
| 1 | 1 | L |
| X | 0 | X |
| X | 1 | X |
| 0 | X | X |
| 1 | X | X |
| X | X | X |

LOGIC DESCRIPTION LIBRARY 1d IN FOURTH PREFERRED EMBODIMENT

TRUTH TABLE OF FIG. 8

| DINP | DINM | DOUT |
|------|------|------|
| 0 | 0 | H |
| 0 | 1 | L |
| 1 | 0 | H |
| 1 | 1 | L |
| X | 0 | X |
| X | 1 | X |
| 0 | X | X |
| 1 | X | X |
| X | X | X |

LOGIC DESCRIPTION LIBRARY 1e IN FIFTH PREFERRED EMBODIMENT

TRUTH TABLE OF FIG. 10

| DINP | DINM | DOUT |
|------|------|------|
| 0 | 0 | X |
| 0 | 1 | L |
| 1 | 0 | H |
| 1 | 1 | X |
| X | 0 | X |
| X | 1 | X |
| 0 | X | X |
| 1 | X | X |
| X | X | X |

LOGIC DESCRIPTION LIBRARY 1f IN SIXTH PREFERRED EMBODIMENT

DIAGRAM SHOWING VOLTAGE APPLICATION METHOD WHEN TESTING DIFFERENTIAL INPUT CIRCUIT IN BACKGROUND ART

LOGIC DESCRIPTION LIBRARY OF DIFFERENTIAL INPUT CIRCUIT IN BACKGROUND ART

TRUTH TABLE OF FIG. 14

| DINP | DINM | DOUT |
|------|------|------|
| 0 | 0 | L |
| 0 | 1 | L |
| 1 | 0 | H |
| 1 | 1 | H |
| X | 0 | X |
| X | 1 | X |
| 0 | X | L |
| 1 | X | H |
| X | X | X |

# LOGIC DESCRIPTION LIBRARY OF DIFFERENTIAL INPUT CIRCUIT

CROSS-REFERENCE TO RELATED APPLICATIONS

This application is based upon and claims the benefit of priority from each of the prior Japanese Patent Application No. 2004-224451 filed on Jul. 30, 2004, the entire contents of which are incorporated herein by reference.

BACKGROUND OF THE INVENTION

1. Field of the Invention

The present invention relates to a logic description library used when handling a differential input circuit by a logic simulator, and more particularly to a logic description library of differential input circuit in which logic description is expressed by logic primitive.

2. Description of the Related Art

A general differential input circuit functions by detecting a valid input and output response when an output signal responds depending on a voltage difference between differential input signals. That is, depending on the voltage difference between a positive side differential input signal VIN+ and a negative side differential input signal VIN−, the input and output response inverts the logic level of output signal, depending on whether the positive side voltage is higher than the negative side or the negative side voltage is higher than the positive side, which is a response characteristic of general differential input circuit. The voltage level itself of individual differential input signal does not have any specific meaning, and is not handled as valid input and output response in the differential input circuit.

When testing a circuit device having such differential input circuit, it is enough to test by feeding a differential signal having differential voltage ΔVIN as differential input signals VIN+, VIN−, and a voltage application method as shown in FIG. 13 is employed. For example, by fixing the negative side differential input signal VIN− at reference voltage Vref, the input and output response is tested by increasing or decreasing the positive side differential input signal VIN+ from the reference voltage Vref. As a result, a differential signal having differential voltage ΔVIN is obtained as differential input signals VIN+, VIN−. When the positive side differential input signal VIN+ is higher than the negative side differential input signal VIN−, for example, a high level is issued as output expectation value. It has been enough to apply a voltage by fixing one of differential input signals VIN+, VIN− at reference voltage Vref.

At this time, the positive side differential input signal VIN+ and output expectation value are input and output responses in phase. In this relation, to evaluate the operation input circuit action of test pattern of differential input signals VIN+, VIN− applied in test, a logic description library of differential input circuit as shown in FIG. 14 has been used in a conventional logic simulator. The test pattern is generated by a test pattern generator or the like. FIG. 15 is a truth table in the logic description library in FIG. 14.

According to FIGS. 14 and FIG. 15, regardless of the negative side logic input signal DINM which is logic description signal of negative side differential input signal VIN−, the logic level of positive side logic input signal DINP which is logic description signal of positive side differential input signal VIN+ is issued as it is as output expectation value DOUT. The combination of (DINP, DINM)=(0, 1), (1, 0) in logic input signals corresponds respectively to a case of negative side differential input signal VIN− higher than positive side differential input signal VIN+, and a case of negative side differential input signal VIN− lower than positive side differential input signal VIN+, and accordingly the output expectation values are low level (L) and high level (H) respectively, so that a normal input and output response to differential input is realized.

In a general differential input circuit, a valid input and output response characteristic is obtained for the differential voltage between differential input signals, and the voltage level itself of individual differential input signals does not have any specific meaning. Hence, in the truth table (FIG. 15) of the logic description library in FIG. 14, while defining the logic level (state of 0, 1 in FIG. 15) in either logic input signal, it is not necessary to consider a state of undefined logic level (state of X in FIG. 15) about other logic input signal.

In a differential input circuit supporting a new specification represented by USB interface being used recently, not only the differential signal between differential input signals is a valid input signal. It may be also significant when the both differential input signals are at a specified voltage level.

In the logic description library of differential input circuit shown in FIG. 14 and FIG. 15, both differential input signals VIN+ and VIN− may be low level or high level, and such case is expressed as (DINP, DINM)=(0, 0), (1, 1), and each output expectation value is low level (L) and high level (H). This input and output response corresponds to the USB interface. Together with the response characteristic corresponding to the differential signal which is input and output response to (DINP, DINM)=(0, 1), (1, 0), in the condition of defining of voltage levels of positive side/negative side differential input signals VIN+, VIN−, this logic description library may correspond to the differential input circuit used in the USB interface.

SUMMARY OF THE INVENTION

However, in this logic description library, since the logic level of positive side logic input signal DINP is issued as output expectation value, even if the negative side logic input signal DINM is undefined, as far as the logic level of logic input signal DINP is defined, there is a problem that the defined logic level is issued as output expectation value. In a circuit device, when the positive side differential input signal VIN+ is at specified voltage level, if the negative side differential input signal VIN− does not reach the specified voltage level, since the differential input signal VIN− is an undefined voltage level, an undefined signal should be issued as output signal, but in the logic simulator using the logic description library, the output expectation value is defined, and a wrong test pattern may be generated.

The invention has been made to solve the problems of the background art, and hence has an object to provide a logic description library of differential input circuit capable of expressing logically, including the input and output response characteristic depending on the voltage level of each differential input signal, in addition to the input and output response characteristic depending on the differential voltage between differential input signal, in a differential input circuit.

To achieve the object, the logic description library of differential input circuit of the invention is a logic description library of differential input circuit expressing so as to be capable of simulating input and output response of differential input circuit in a logic simulator, characterized by having a first logic primitive for issuing an undefined state as output expectation value when at least either differential input signal is in undefined state.

In the logic description library of differential input circuit of the invention, when expressing the differential input circuit so as to be simulated by the logic simulator, the first logic primitive is used, and an undefined state is issued as output expectation value when at least either differential input signal is in undefined state.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

The logic description library of differential input circuit of the invention is described below by referring to its preferred embodiments shown in FIG. 1 to FIG. 12.

Figures 1, 2:
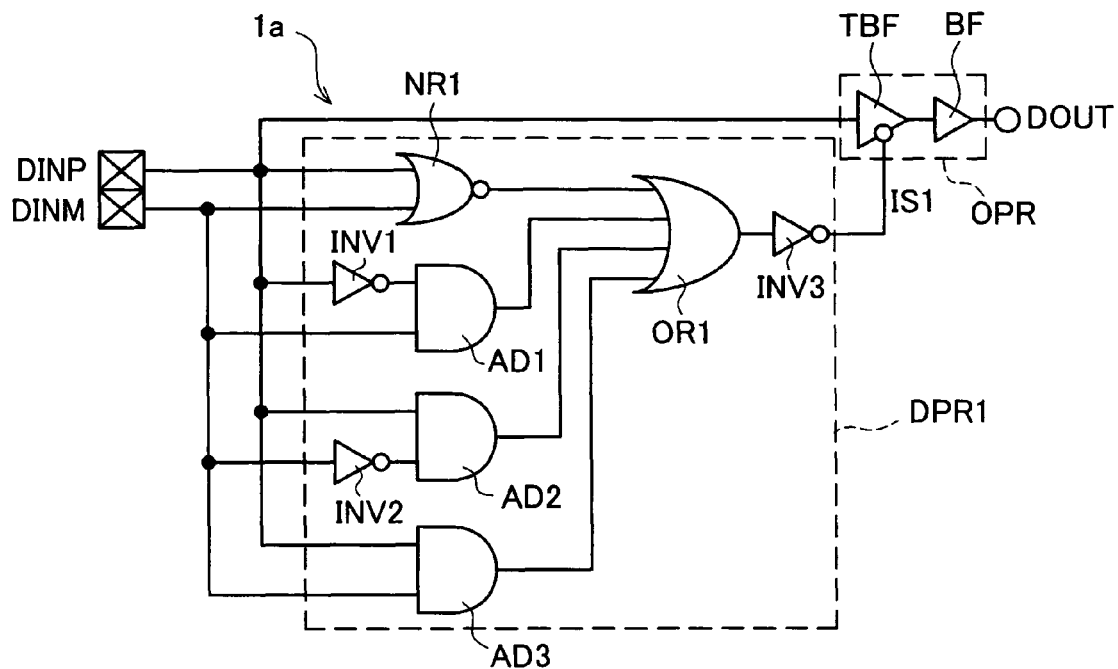
FIG. 1 is a logic description library 1a in a first preferred embodiment.
FIG. 2 is a truth table of FIG. 1.

A logic description library 1a in a first preferred embodiment is shown in FIG. 1, and its truth table is shown in FIG. 2. The logic description library 1a is a logic description library issuing an undefined signal as output expectation value DOUT when at least either positive side logic input signal DINP or negative side logic input signal DINM is at undefined logic level. The logic description library 1a is also a logic description library in which output expectation value DOUT is at low level when both positive side logic input signal DINP and negative side logic input signal DINM are at low level, and output expectation value DOUT is at high level when both are at high level.

The logic description library 1a comprises a first detection logic primitive DPR1 and output control logic primitive OPR. The first detection logic primitive DPR1 includes NOR gate NR1, AND gates AD1 to AD3, OR gate OR1, and inverters INV1 to INV3. Positive side logic input signal DINP is supplied into NOR gate NR1 and AND gates AD2 and AD3, and is further supplied into AND gate AD1 by way of inverter INV1. Negative side logic input signal DINM is supplied into NOR gate NR1 and AND gates AD1 and AD3, and is further supplied into AND gate AD2 by way of inverter INV2. Outputs of NOR gate NR1 and AND gates AD1 to AD3 are put into OR gate OR1. Output of OR gate OR1 is fed into tristate buffer TBF of output control logic primitive OPR as first detection signal IS1 by way of inverter INV3.

The output control logic primitive OPR includes tristate buffer TBF and buffer BF. The tristate buffer TBF receives positive side logic input signal DINP, and also receives first detection signal IS1 which is an output signal of inverter INV3, as control signal. The tristate buffer TBF functions as buffer when the first detection signal IS1 is at low level, and is controlled in floating state when the first detection signal IS1 is at high level. This is a so-called negative active control. The output of tristate buffer TBF is issued as output expectation value DOUT by way of the buffer BF. FIG. 1 shows an example of second logic primitive composed of NOR gate NR1, OR gate OR1, inverter INV3, tristate buffer TBF, and buffer BF. It also shows an example of sixth logic primitive composed of AND gate AD3, OR gate OR1, inverter INV3, tristate buffer TBF, and buffer BF. Further, an example of first logic primitive is composed of first detection logic primitive DPR1 and output control logic primitive OPR. The first detection logic primitive DPR1 is an example of detection logic primitive, and the output control logic primitive OPR is an example of output control logic primitive.

When both positive side logic input signal DINP and negative side logic input signal DINM are at low level, the operation of the logic description library 1a is explained by referring to the truth table in FIG. 2. The tristate buffer TBF receives positive side logic input signal DINP of low level. The output of NOR gate NR1 is at high level. The output of NOR gate NR1 is at high level. Since a high level signal is entered from the NOR gate NR1, the output of OR gate OR1 is defined at high level. A first detection signal IS1 inverted to low level by inverter INV3 is supplied into the tristate buffer TBF. The tristate buffer TBF undergoes negative active control, and operates as buffer by the first detection signal IS1 of low level, and hence a low level signal in phase with the positive side logic input signal DINP is issued as output expectation value DOUT by way of the buffer BF (FIG. 2).

When both positive side logic input signal DINP and negative side logic input signal DINM are at high level, the operation is explained below. The tristate buffer TBF receives positive side logic input signal DINP of high level. The output of AND gate AD3 is at high level. Since a high level signal is entered from the AND gate AD3, the output of OR gate OR1 is defined at high level. A first detection signal IS1 inverted to low level by inverter INV3 is supplied into the tristate buffer TBF. The tristate buffer TBF undergoes negative active control, and operates as buffer by the first detection signal IS1 of low level, and hence a high level signal in phase with the positive side logic input signal DINP is issued as output expectation value DOUT by way of the buffer BF (FIG. 2).

When positive side logic input signal DINP is at low level and negative side logic input signal DINM is at high level, the operation is explained below. The tristate buffer TBF receives positive side logic input signal DINP of low level. The output of AND gate AD1 is at high level. Since a high level signal is entered from the AND gate AD1, the output of OR gate OR1 is defined at high level. A first detection signal IS1 inverted to low level by inverter INV3 is supplied into the tristate buffer TBF, and hence a low level signal in phase with the positive side logic input signal DINP is issued as output expectation value DOUT by way of the buffer BF (FIG. 2).

On the other hand, when positive side logic input signal DINP is at high level and negative side logic input signal DINM is at low level, the operation is explained below. The tristate buffer TBF receives positive side logic input signal DINP of high level. The output of AND gate AD2 is at high level. Since a high level signal is entered from the AND gate AD2, the output of OR gate OR1 is defined at high level. A first detection signal IS1 inverted to low level by inverter INV3 is supplied into the tristate buffer TBF, and hence a high level signal in phase with the positive side logic input signal DINP is issued as output expectation value DOUT by way of the buffer BF (FIG. 2).

When at least either positive side logic input signal DINP or negative side logic input signal DINM is at undefined logic level (undefined level), the operation of the logic description library 1a is explained below. First, suppose the positive side logic input signal DINP to be at low level and negative side logic input signal DINM to be at undefined level. The output signal of NOR gate NR1 is at undefined level. Since a high level signal and undefined level signal are entered in the AND gate AD1, its output is at undefined level. The AND gates AD2 and AD3 receive positive side logic input signal DINP of low level, and their outputs are defined at low level. Hence undefined level and low level signals are entered in the OR gate OR1, the output of the OR gate OR1 is at undefined level, and a first detection signal IS1 issued through inverter INV3 is also at undefined level. As a result, the output expectation value DOUT issued from the output control logic primitive OPR is at undefined level (FIG. 2).

When positive side logic input signal DINP is at high level and negative side logic input signal DINM is at undefined level, the operation is explained below. Output signals of NOR gate NR1 and AND gate AD1 are defined at low level. Since a high level signal and an undefined level signal are entered in the AND gates AD2 and AD3, both output signals are at undefined level. Hence undefined level and low level signals are entered in the OR gate OR1, the output of the OR gate OR1 and a first detection signal IS1 issued through inverter INV3 are set at undefined level, and the output expectation value DOUT issued from the output control logic primitive OPR is at undefined level (FIG. 2).

When positive side logic input signal DINP is at undefined level and negative side logic input signal DINM is at low level, the operation is explained below. The output signal of NOR gate NR1 is at undefined level. The AND gate AD2 receives a high level signal and an undefined level signal, and its output is at undefined level. Since a low level signal and an undefined level signal are entered in the AND gates AD1 and AD3, both output signals are defined at low level. Hence undefined level and low level signals are entered in the OR gate OR1, a first detection signal IS1 issued through inverter INV3 is set at undefined level, and the output expectation value DOUT issued from the output control logic primitive OPR is at undefined level (FIG. 2).

When positive side logic input signal DINP is at undefined level and negative side logic input signal DINM is at high level, the operation is explained below. The output signal of NOR gate NR1 is at low level. The AND gates AD1 and AD3 receive a high level signal and an undefined level signal, and their outputs are at undefined level. Since a low level signal and an undefined level signal are entered in the AND gate AD2, its output is defined at low level. Hence undefined level and low level signals are entered in the OR gate OR1, a first detection signal IS1 issued through inverter INV3 is set at undefined level, and the output expectation value DOUT issued from the output control logic primitive OPR is at undefined level (FIG. 2).

When both positive side logic input signal DINP and negative side logic input signal DINM are at undefined level, a first detection signal IS1 is at undefined level, and the output expectation value DOUT issued from the output control logic primitive OPR is at undefined level (FIG. 2).

Accordingly, when the negative side logic input signal DINM is at undefined level, regardless of the level of the positive side logic input signal DINP, a signal of undefined level is issued as the output expectation value DOUT. When the positive side logic input signal DINP is at undefined level, regardless of the level of the negative side logic input signal DINM, a signal of undefined level is issued as the output expectation value DOUT. That is, the output control logic primitive OPR issues a signal of undefined level as output expectation value DOUT when the first detection logic primitive DPR1 detects undefined level at least in either positive side logic input signal DINP or negative side logic input signal DINM.

Hence, in the logic simulator using the logic description library 1a, an undefined signal can be issued when at least either positive side logic input signal DINP or negative side logic input signal DINM is at undefined level and an undefined level should be issued as output expectation value. Further, when both positive side logic input signal DINP and negative side logic input signal DINM are at low level, an output expectation value of low level is issued, and when both positive side logic input signal DINP and negative side logic input signal DINM are at high level, an output expectation value of high level is issued. Thus, the operation of the truth table in FIG. 2 is realized. It hence avoids a problem of output of logic level defined as output expectation value when the logic level of the logic input signal DINP is defined, even if the negative side logic input signal DINM is undefined, as a result of output of logic level of positive side logic input signal DINP as output expectation value. Therefore, correct action input circuit operation in a test pattern close to actual operation level generated by a test pattern generator can be confirmed by the logic simulator of the invention, so that the accuracy as test data can be enhanced.

By the logic description library 1a, in addition to the input and output response depending on the differential voltage between differential input signals of positive side logic input signal DINP and negative side logic input signal DINM, the input and output response can be correctly expressed depending on the voltage level of individual differential input signals. By the logic simulation using the logic description library 1a, in the test pattern generated by the test pattern generator, a correct output expectation value can be obtained in all combinations of differential input signals entered in the differential input circuit. A differential input circuit expressed by applying the logic description library 1a includes, for example, a differential input signal receiving a differential signal coinciding with the specification of the USB interface or small amplitude action interface.

Figure 3:
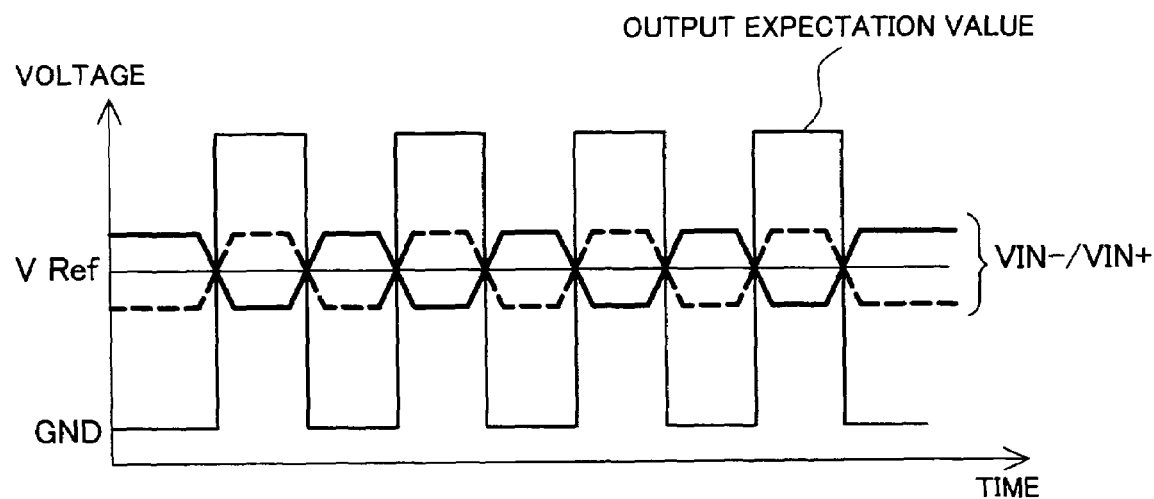
FIG. 3 is a diagram showing voltage application method when testing a differential input circuit in the invention.

In the case of using the logic description library 1a of the differential input circuit shown in FIG. 1, a voltage application method when testing the differential input circuit is shown in FIG. 3. Using the logic description library 1a, as shown in the truth table in FIG. 2, for positive side/negative side logic input signal DINP/DINM, positive/negative logic levels "0" and "1" and undefined level "X" can be entered individually. Hence, instead of fixing one of differential input signal VIN+, VIN− at reference voltage Vref, a correct action input circuit operation of differential input signals VIN+, VIN− on the basis of the test pattern close to the actual operation level generated by the test pattern generator can be confirmed by the logic simulator using the logic description library 1a. That is, as shown in FIG. 3, voltage levels can be set individually in differential input signal VIN+, VIN−. Therefore, even when the differential input signals are both at specified voltage level, a valid test can be done in the differential input circuit supporting the USB interface having a significant meaning, small amplitude action interface, or other new specification.

Figures 4, 5:
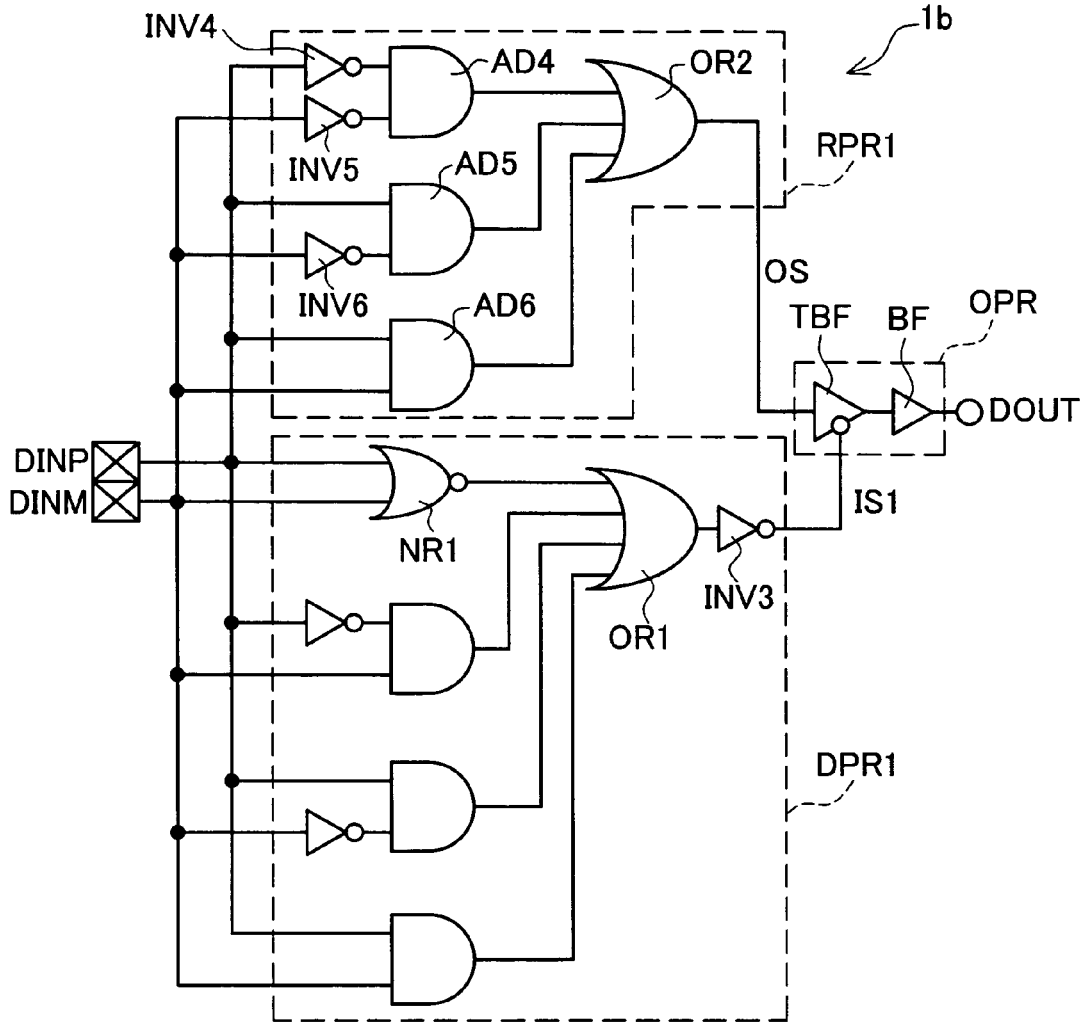
FIG. 4 is a logic description library 1b in a second preferred embodiment.
FIG. 5 is a truth table of FIG. 4 and FIG. 12.

A logic description library 1b in a second preferred embodiment is shown in FIG. 4, and its truth table is shown in FIG. 5. The logic description library 1b is a logic description library issuing an undefined signal as output expectation value DOUT when at least either positive side logic input signal DINP or negative side logic input signal DINM is at undefined logic level. The logic description library 1b is also a logic description library in which output expectation value DOUT is at high level whether both positive side logic input signal DINP and negative side logic input signal DINM are at low level, or both are at high level.

The logic description library 1b comprises a first response logic primitive RPR1, in addition to the first detection logic primitive DPR1 and output control logic primitive OPR in the first preferred embodiment. The first response logic primitive RPR1 includes AND gates AD4 to AD6, inverters INV4 to INV6, and OR gate OR2. Positive side logic input signal DINP is supplied into AND gates AD5 and AD6, and is further supplied into AND gate AD4 by way of inverter INV4. Negative side logic input signal DINM is supplied into AND gate AD6, and is further supplied into AND gates AD4 and AD5 by way of inverters INV5 and INV6 individually. Outputs of AND gates AD4 to AD6 are put into OR gate OR2. Output of OR gate OR2 is an output expectation signal OS, which is fed into tristate buffer TBF. Other configuration is same as in the first preferred embodiment, and detailed description is omitted. FIG. 4 shows an example of third logic primitive composed of AND gate AD4, inverters INV4 and INV5, OR gate OR2, tristate buffer TBF, buffer BF, NOR gate NR1, OR gate OR1, and inverter INV3. Further, an example of first logic primitive is composed of first detection logic primitive DPR1 and output control logic primitive OPR. The first detection logic primitive DPR1 is an example of detection logic primitive, the output control logic primitive OPR is an example of output control logic primitive, and the first response logic primitive RPR1 is an example of response logic primitive.

When both positive side logic input signal DINP and negative side logic input signal DINM are at low level, the operation of the logic description library 1b is explained by referring to the truth table in FIG. 5. The AND gate AD4 receives signals of high level from both inverters INV4 and INV5, and the output of the AND gate AD4 is at high level. Since a high level signal is entered from the AND gate AD4, the output expectation signal OS issued from the OR gate OR2 is defined at high level. Same as in the first preferred embodiment, a first detection signal IS1 of low level issued from the inverter INV3 is supplied into the tristate buffer TBF. Hence a high level signal in phase with the output expectation signal OS is issued as output expectation value DOUT by way of the buffer BF (FIG. 5).

When both positive side logic input signal DINP and negative side logic input signal DINM are at high level, the operation of the logic description library 1b is explained below. The AND gate AD6 receives positive side logic input signal DINP and negative side logic input signal DINM of high level, and the output of the AND gate AD6 is at high level. Since a high level signal is entered from the AND gate AD6, the output expectation signal OS issued from the OR gate OR2 is defined at high level. Same as in the first preferred embodiment, a first detection signal IS1 of low level issued from the inverter INV3 is supplied into the tristate buffer TBF. Hence a high level signal in phase with the output expectation signal OS is issued as output expectation value DOUT by way of the buffer BF (FIG. 5).

When positive side logic input signal DINP is at low level and negative side logic input signal DINM is at high level, the operation is explained below. Since outputs from AND gates AD4 to AD6 are all at low level, the output expectation signal OS issued from the OR gate OR2 is at low level. Same as in the first preferred embodiment, a first detection signal IS1 of low level issued from the inverter INV3 is supplied into the tristate buffer TBF. Hence a low level signal in phase with the output expectation signal OS is issued as output expectation value DOUT by way of the buffer BF (FIG. 5).

On the other hand, when positive side logic input signal DINP is at high level and negative side logic input signal DINM is at low level, the operation is explained below. Since the output from AND gate AD5 is at high level, the output expectation signal OS issued from the OR gate OR2 is defined at high level. Same as in the first preferred embodiment, a first detection signal IS1 of low level issued from the inverter INV3 is supplied into the tristate buffer TBF. Hence a high level signal in phase with the output expectation signal OS is issued as output expectation value DOUT by way of the buffer BF (FIG. 5).

When at least either positive side logic input signal DINP or negative side logic input signal DINM is at undefined level, same as in the first preferred embodiment, a first detection signal IS1 issued from the inverter INV3 is at undefined level. Hence the output expectation value DOUT issued from the output control logic primitive OPR is at undefined level (FIG. 5).

That is, by the first response logic primitive RPR1, depending on the defined specified logic level (DINP, DINM)=(1, 1), (0, 0), (1,0), (0, 1) of positive side logic input signal DINP and negative side logic input signal DINM, the output expectation signal OS realizing the truth table in FIG. 5 is generated. Depending on the detection of the defined logic level of positive side logic input signal DINP and negative side logic input signal DINM by the first detection logic primitive DPR1, the output control logic primitive OPR issues the output expectation signal OS entered from the first response logic primitive RPR1 as output expectation value DOUT. Also depending on the detection of undefined level of at least either positive side logic input signal DINP or negative side logic input signal DINM by the first detection logic primitive DPR1, the output control logic primitive OPR issues an undefined level signal as output expectation value DOUT.

Hence, in the logic simulator using the logic description library 1b, an undefined signal can be issued when at least either positive side logic input signal DINP or negative side logic input signal DINM is at undefined level and an undefined level should be issued as output expectation value. Further, as shown in the truth table in FIG. 5, when both positive side logic input signal DINP and negative side logic input signal DINM are at low level, an operation of output of output expectation value DOUT of high level can be realized. That is, in the logic simulator using the logic description library 1b, when simulating the test pattern, it hence avoids a problem of output of wrong defined output expectation value, instead of output of undefined signal as output signal.

By the logic description library 1b, in addition to the input and output response depending on the differential voltage between differential input signals of positive side logic input signal DINP and negative side logic input signal DINM, the input and output response can be correctly expressed depending on the voltage level of individual differential input signals. By the logic simulation using the logic description library 1b, in the test pattern generated by the test pattern generator, a correct output expectation value can be obtained in all combinations of differential input signals entered in the differential input circuit. A differential input circuit expressed by applying the logic description library 1b includes, for example, a differential input signal receiving a differential signal coinciding with the specification of the USB interface or small amplitude action interface.

Figures 6, 7:
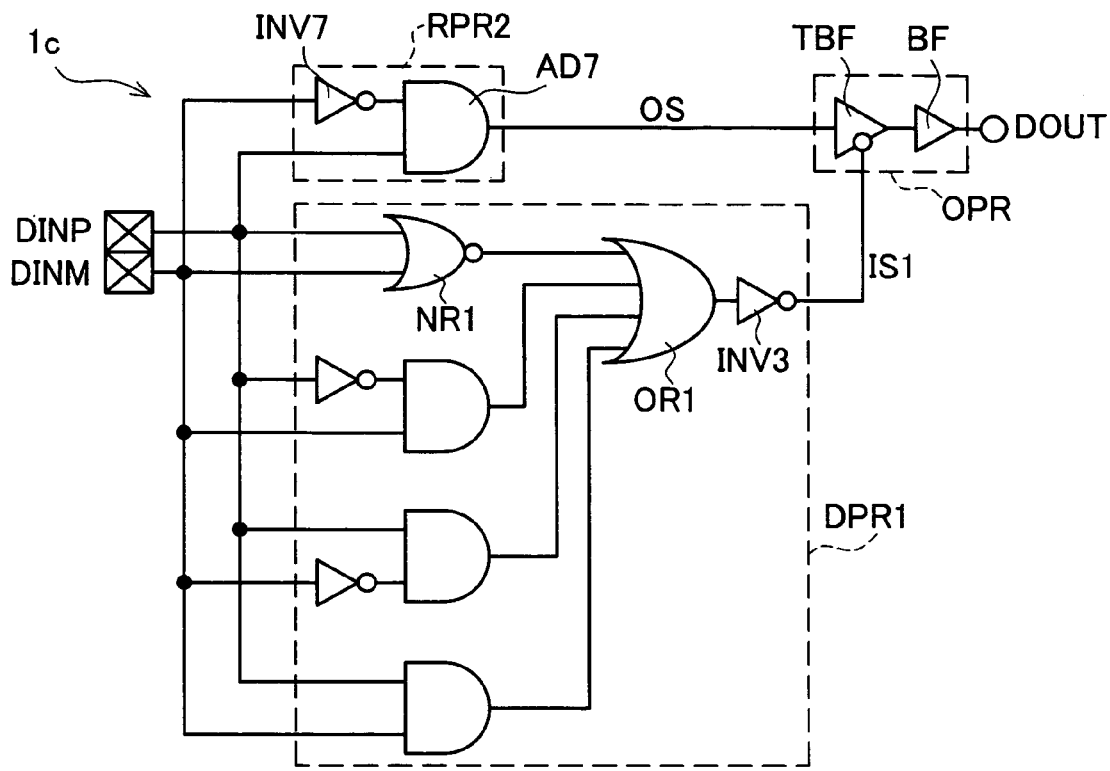
FIG. 6 is a logic description library 1c in a third preferred embodiment.
FIG. 7 is a truth table of FIG. 6.

A logic description library 1c in a third preferred embodiment is shown in FIG. 6, and its truth table is shown in FIG. 7. The logic description library 1c is a logic description library issuing an undefined signal as output expectation value DOUT when at least either positive side logic input signal DINP or negative side logic input signal DINM is at undefined logic level. The logic description library 1c is also a logic description library in which output expectation value DOUT is at low level when both positive side logic input signal DINP and negative side logic input signal DINM are at low level, or both are at high level.

The logic description library 1c comprises a second response logic primitive RPR2, in addition to the first detection logic primitive DPR1 and output control logic primitive OPR in the first preferred embodiment. The second response logic primitive RPR2 includes AND gate AD7 and inverter INV7. Positive side logic input signal DINP is supplied into AND gate AD7. Negative side logic input signal DINM is supplied into AND gate AD7 by way of inverter INV7. An output expectation signal OS is issued from the AND gate AD7, and is fed into the tristate buffer TBF. Other configuration is same as in the first preferred embodiment, and detailed description is omitted. FIG. 6 shows an example of fifth logic primitive composed of inverter INV7, AND gate AD7, tristate buffer TBF, AND gate AD3, OR gate OR1, and inverter INV3. Further, an example of first logic primitive is composed of first detection logic primitive DPR1 and output control logic primitive OPR. The first detection logic primitive DPR1 is an example of detection logic primitive, the output control logic primitive OPR is an example of output control logic primitive, and the second response logic primitive RPR2 is an example of response logic primitive.

When both positive side logic input signal DINP and negative side logic input signal DINM are at low level, the operation of the logic description library 1c is explained by referring to the truth table in FIG. 7. The output expectation signal OS issued from the AND gate AD7 is at low level. Same as in the first preferred embodiment, a first detection signal IS1 of low level issued from the inverter INV3 is supplied into the tristate buffer TBF. Hence a low level signal in phase with the output expectation signal OS is issued as output expectation value DOUT by way of the buffer BF (FIG. 7).

When both positive side logic input signal DINP and negative side logic input signal DINM are at high level, the operation of the logic description library 1c is explained below. The output expectation signal OS issued from the AND gate AD7 is at low level. Same as in the first preferred embodiment, a first detection signal IS1 of low level issued from the inverter INV3 is supplied into the tristate buffer TBF. Hence a low level signal in phase with the output expectation signal OS is issued as output expectation value DOUT by way of the buffer BF (FIG. 7).

When positive side logic input signal DINP is at low level and negative side logic input signal DINM is at high level, the operation is explained below. The output expectation signal OS issued from the AND gate AD7 is at low level. Same as in the first preferred embodiment, a first detection signal IS1 of low level issued from the inverter INV3 is supplied into the tristate buffer TBF. Hence a low level signal in phase with the output expectation signal OS is issued as output expectation value DOUT by way of the buffer BF (FIG. 7).

When positive side logic input signal DINP is at high level and negative side logic input signal DINM is at low level, the operation is explained below. The output expectation signal OS issued from the AND gate AD7 is at high level. Same as in the first preferred embodiment, a first detection signal IS1 of low level issued from the inverter INV3 is supplied into the tristate buffer TBF. Hence a high level signal in phase with the output expectation signal OS is issued as output expectation value DOUT by way of the buffer BF (FIG. 7).

When at least either positive side logic input signal DINP or negative side logic input signal DINM is at undefined level, same as in the first preferred embodiment, a first detection signal IS1 issued from the inverter INV3 is at undefined level. Hence the output expectation value DOUT issued from the output control logic primitive OPR is at undefined level (FIG. 7).

That is, by the second response logic primitive RPR2, depending on the defined specified logic level (DINP, DINM)=(1, 1), (0, 0), (1, 0), (0, 1) of positive side logic input signal DINP and negative side logic input signal DINM, the output expectation signal OS realizing the truth table in FIG. 7 is generated. Depending on the detection of the defined logic level of positive side logic input signal DINP and negative side logic input signal DINM by the first detection logic primitive DPR1, the output control logic primitive OPR issues the output expectation signal OS entered from the second response logic primitive RPR2 as output expectation value DOUT. Also depending on the detection of undefined level of at least either positive side logic input signal DINP or negative side logic input signal DINM by the first detection logic primitive DPR1, the output control logic primitive OPR issues an undefined level signal as output expectation value DOUT.

Hence, in the logic simulator using the logic description library 1c, an undefined signal can be issued when at least either positive side logic input signal DINP or negative side logic input signal DINM is at undefined level and an undefined level should be issued as output expectation value. Further, as shown in the truth table in FIG. 7, when both positive side logic input signal DINP and negative side logic input signal DINM are at high level, an operation of output of output expectation value DOUT of low level can be realized. That is, in the logic simulator using the logic description library 1c, when simulating the test pattern, it hence avoids a problem of output of wrong defined output expectation value, instead of output of undefined signal as output signal.

By the logic description library 1c, in addition to the input and output response depending on the differential voltage between differential input signals of positive side logic input signal DINP and negative side logic input signal DINM, the input and output response can be correctly expressed depending on the voltage level of individual differential input signals. By the logic simulation using the logic description library 1c, in the test pattern generated by the test pattern generator, a correct output expectation value can be obtained in all combinations of differential input signals entered in the differential input circuit.

Figures 8, 9:
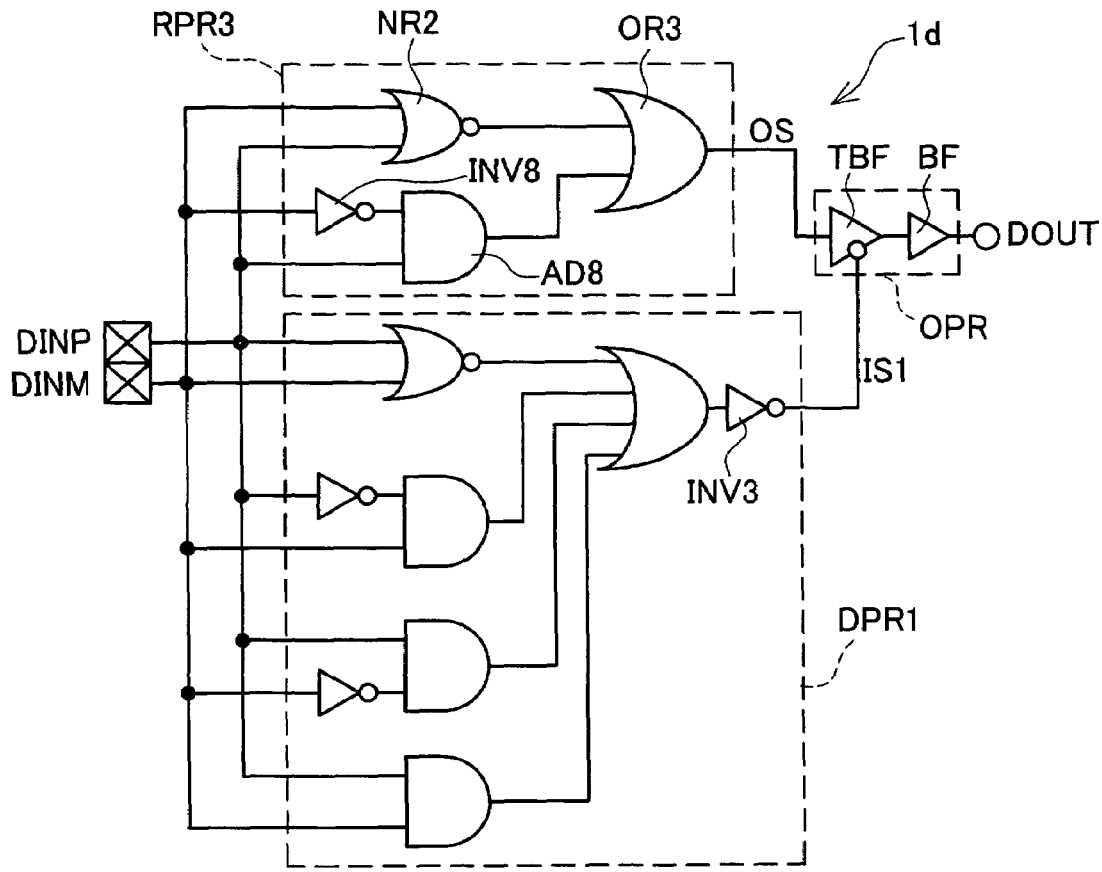
FIG. 8 is a logic description library 1d in a fourth preferred embodiment.
FIG. 9 is a truth table of FIG. 8.

A logic description library 1d in a fourth preferred embodiment is shown in FIG. 8, and its truth table is shown in FIG. 9. The logic description library 1d is a logic description library issuing an undefined signal as output expectation value DOUT when at least either positive side logic input signal DINP or negative side logic input signal DINM is at undefined logic level. The logic description library 1d is also a logic description library in which output expectation value DOUT is at high level when both positive side logic input signal DINP and negative side logic input signal DINM are at low level, and output expectation value DOUT is at low level when both are at high level.

The logic description library 1d comprises a third response logic primitive RPR3, in addition to the first detection logic primitive DPR1 and output control logic primitive OPR in the first preferred embodiment. The third response logic primitive RPR3 includes AND gate AD8, inverter INV8, NOR gate NR2, and OR gate OR3. Positive side logic input signal DINP is supplied into AND gate AD8 and NOR gate NR2. Negative side logic input signal DINM is supplied into NOR gate NR2, and is also supplied into AND gate AD8 by way of inverter INV8. Outputs of NOR gate NR2 and AND gate AD8 are both fed into OR gate OR3. An output expectation signal OS is issued from the OR gate OR3, and is fed into the tristate buffer TBF. Other configuration is same as in the first preferred embodiment, and detailed description is omitted. An example of first logic primitive is composed of first detection logic primitive DPR1 and output control logic primitive OPR. The first detection logic primitive DPR1 is an example of detection logic primitive, the output control logic primitive OPR is an example of output control logic primitive, and the third response logic primitive RPR3 is an example of response logic primitive.

When both positive side logic input signal DINP and negative side logic input signal DINM are at low level, the operation of the logic description library 1d is explained by referring to the truth table in FIG. 9. The output signal of AND gate AD8 is at low level, and the output signal of NOR gate NR2 is at high level. Hence, the output expectation signal OS issued from the OR gate OR3 is at high level. Same as in the first preferred embodiment, a first detection signal IS1 of low level issued from the inverter INV3 is supplied into the tristate buffer TBF. Hence a high level signal in phase with the output expectation signal OS is issued as output expectation value DOUT by way of the buffer BF (FIG. 9).

When both positive side logic input signal DINP and negative side logic input signal DINM are at high level, the operation of the logic description library 1d is explained below. The output signals of AND gate AD8 and NOR gate NR2 are both at low level. Hence, the output expectation signal OS issued from the OR gate OR3 is at low level. Same as in the first preferred embodiment, a first detection signal IS1 of low level issued from the inverter INV3 is supplied into the tristate buffer TBF. Hence a low level signal in phase with the output expectation signal OS is issued as output expectation value DOUT by way of the buffer BF (FIG. 9).

When positive side logic input signal DINP is at low level and negative side logic input signal DINM is at high level, the operation is explained below. The output signals of AND gate AD8 and NOR gate NR2 are both at low level. Hence the output expectation signal OS issued from the OR gate OR3 is at low level. Same as in the first preferred embodiment, a first detection signal IS1 of low level issued from the inverter INV3 is supplied into the tristate buffer TBF. Hence a low level signal in phase with the output expectation signal OS is issued as output expectation value DOUT by way of the buffer BF (FIG. 9).

When positive side logic input signal DINP is at high level and negative side logic input signal DINM is at low level, the operation is explained below. The output signal of AND gate AD8 is at high level and the output signal of NOR gate NR2 is at low level. Hence the output expectation signal OS issued from the OR gate OR3 is at high level. Same as in the first preferred embodiment, a first detection signal IS1 of low level issued from the inverter INV3 is supplied into the tristate buffer TBF. Hence a high level signal in phase with the output expectation signal OS is issued as output expectation value DOUT by way of the buffer BF (FIG. 9).

When at least either positive side logic input signal DINP or negative side logic input signal DINM is at undefined level, same as in the first preferred embodiment, a first detection signal IS1 issued from the inverter INV3 is at undefined level. Hence the output expectation value DOUT issued from the output control logic primitive OPR is at undefined level (FIG. 9).

That is, by the third response logic primitive RPR3, depending on the defined specified logic level (DINP, DINM)=(1, 1), (0, 0), (1, 0), (0, 1) of positive side logic input signal DINP and negative side logic input signal DINM, the output expectation signal OS realizing the truth table in FIG. 9 is generated. Depending on the detection of the defined logic level of positive side logic input signal DINP and negative side logic input signal DINM by the first detection logic primitive DPR1, the output control logic primitive OPR issues the output expectation signal OS entered from the third response logic primitive RPR3 as output expectation value DOUT. Also depending on the detection of undefined level of at least either positive side logic input signal DINP or negative side logic input signal DINM by the first detection logic primitive DPR1, the output control logic primitive OPR issues an undefined level signal as output expectation value DOUT.

Hence, in the logic simulator using the logic description library 1d, an undefined signal can be issued when at least either positive side logic input signal DINP or negative side logic input signal DINM is at undefined level and an undefined level should be issued as output expectation value. Further, as shown in the truth table in FIG. 9, according to the operation realized herein, when both positive side logic input signal DINP and negative side logic input signal DINM are at low level, the output expectation value DOUT is at high level, and when both positive side logic input signal DINP and negative side logic input signal DINM are at high level, the output expectation value DOUT is at low level. That is, in the logic simulator using the logic description library 1d, when simulating the test pattern, it hence avoids a problem of output of wrong defined output expectation value, instead of output of undefined signal as output signal.

By the logic description library 1d, in addition to the input and output response depending on the differential voltage between differential input signals of positive side logic input signal DINP and negative side logic input signal DINM, the input and output response can be correctly expressed depending on the voltage level of individual differential input signals. By the logic simulation using the logic description library 1d, in the test pattern generated by the test pattern generator, a correct output expectation value can be obtained in all combinations of differential input signals entered in the differential input circuit.

Figures 10, 11:
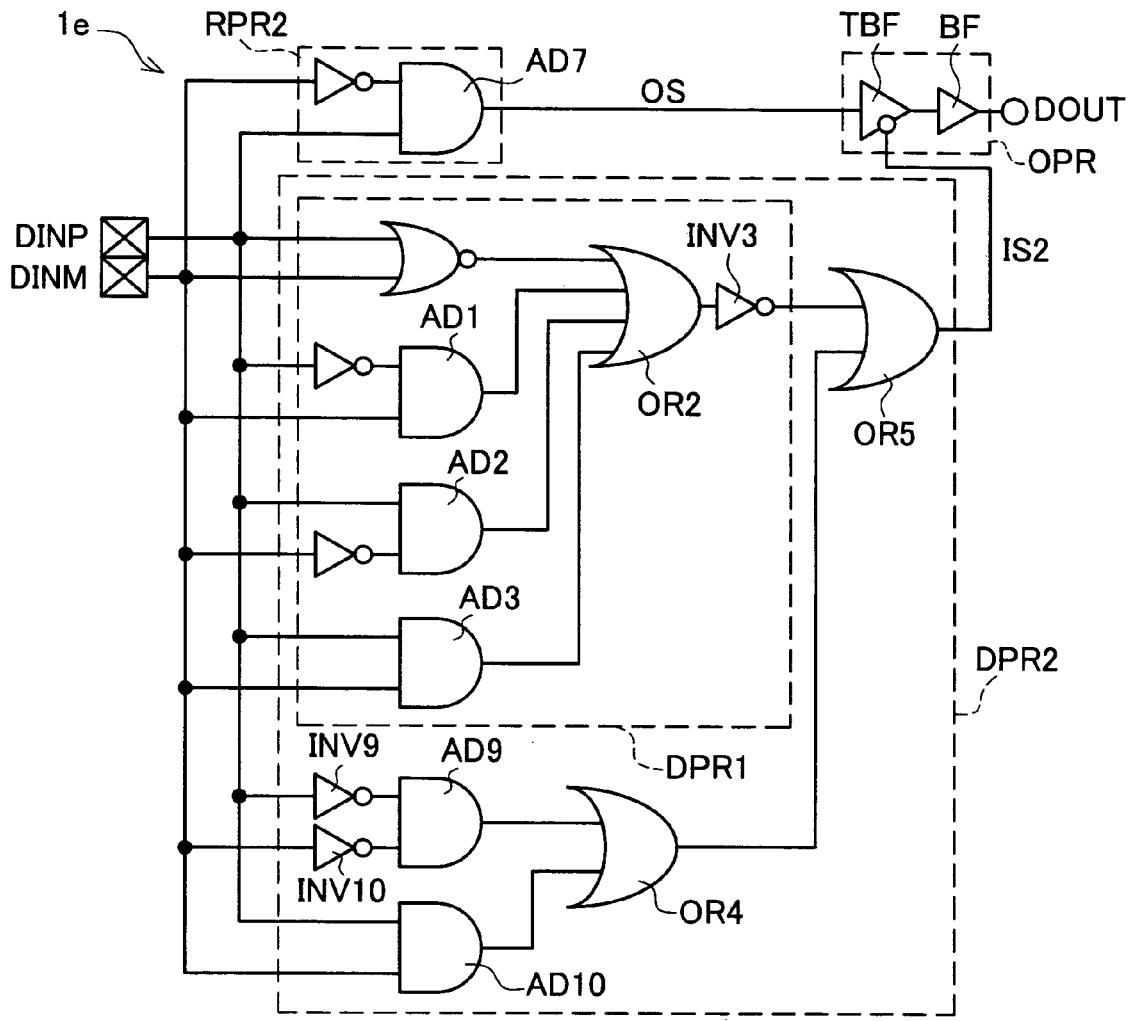
FIG. 10 is a logic description library 1e in a fifth preferred embodiment.
FIG. 11 is a truth table of FIG. 10.

A logic description library 1e in a fifth preferred embodiment is shown in FIG. 10, and its truth table is shown in FIG. 11. The logic description library 1e is a logic description library issuing an undefined signal as output expectation value DOUT when at least either positive side logic input signal DINP or negative side logic input signal DINM is at undefined logic level. The logic description library 1e is also a logic description library in which output expectation value DOUT is at undefined level when both positive side logic input signal DINP and negative side logic input signal DINM are at low level, or both are at high level.

The logic description library 1e comprises a second detection logic primitive DPR2, an output control logic primitive OPR, and a second response logic primitive RPR2. The second detection logic primitive DPR2 includes, in addition to the first detection logic primitive DPR1, AND gates AD9 and AD10, inverters INV9 and INV10, and OR gates OR4 and OR5. Positive side logic input signal DINP is supplied into AND gate AD10, and is also supplied into AND gate AD9 by way of inverter INV9. Negative side logic input signal DINM is supplied into AND gate AD10, and is also supplied into AND gate AD9 by way of inverter INV10. Outputs of AND gates AD9 and AD10 are both fed into OR gate OR4. Output of OR gate OR4 and output of inverter INV3 are fed into OR gate OR5. Output of OR gate OR5 is fed into the tristate buffer TBF of output control logic primitive OPR as second detection signal IS2. Other configuration is same as in the third preferred embodiment (FIG. 6), and detailed description is omitted. In FIG. 10, an example of fourth logic primitive is composed of inverters INV9 and INV10, AND gate AD9, OR gates OR4 and OR5, tristate buffer TBF, and buffer BF. An example of seventh logic primitive is composed of AND gate AD10, OR gates OR4 and OR5, tristate buffer TBF, and buffer BF. An example of first logic primitive is composed of second detection logic primitive DPR2 and output control logic primitive OPR. The second detection logic primitive DPR2 is an example of detection logic primitive, the output control logic primitive OPR is an example of output control logic primitive, and the second response logic primitive RPR2 is an example of response logic primitive.

When both positive side logic input signal DINP and negative side logic input signal DINM are at low level, the operation of the logic description library 1e is explained. The output signal of AND gate AD9 is at high level, and the output of OR gate OR4 is defined at high level. Hence, the output signal of the OR gate OR5, that is, second detection signal IS2, is defined at high level. When the second detection signal IS2 of high level is supplied into the tristate buffer TBF, its buffer function is stopped, and a high impedance state is established, and the output expectation value DOUT is at undefined level (FIG. 11).

When both positive side logic input signal DINP and negative side logic input signal DINM are at high level, the operation of the logic description library 1e is explained by referring to the truth table in FIG. 11. The output signals of AND gate AD10 is at high level, and the output of the OR gate OR4 is defined at high level, and the output signal of the OR gate OR5, that is, second detection signal IS2, is also defined at high level. The second detection signal IS2 of high level is supplied into the tristate buffer TBF, and a high impedance state is established, and the output expectation value DOUT is at undefined level (FIG. 11).

When positive side logic input signal DINP is at low level and negative side logic input signal DINM is at high level, the operation is explained below. The output signal of AND gate AD1 is at high level, and the output of OR gate OR2 is defined at high level, and a low level signal is issued from the inverter INV3. The output signals of AND gates AD9 and AD10 are both at low level, and the output of OR gate OR4 is defined at low level. Low level signals are also fed into OR gate OR5, and second detection signal IS2 of low level is issued. The output expectation signal OS issued from the AND gate AD7 provided in the second response logic primitive RPR2 is at low level. Hence a low level signal in phase with the output expectation signal OS is issued as output expectation value DOUT by way of the buffer BF (FIG. 11).

When positive side logic input signal DINP is at high level and negative side logic input signal DINM is at low level, the operation is explained below. The output signal of AND gate AD2 is at high level, and the output of OR gate OR2 is defined at high level, and a low level signal is issued from the inverter INV3. The output signals of AND gates AD9 and AD10 are both at low level, and the output of OR gate OR4 is defined at low level. Low level signals are also fed into OR gate OR5, and second detection signal IS2 of low level is issued. The output expectation signal OS issued from the AND gate AD7 provided in the second response logic primitive RPR2 is at high level. Hence a high level signal in phase with the output expectation signal OS is issued as output expectation value DOUT by way of the buffer BF (FIG. 11).

When at least either positive side logic input signal DINP or negative side logic input signal DINM is at undefined level, same as in the first preferred embodiment, the output signal of the inverter INV3 is at undefined level. The output of OR gate OR4 is also at undefined level. Undefined level signals are also fed into OR gate OR5, and second detection signal IS2 issued from OR gate OR5 is at undefined level. Hence the output expectation value DOUT issued from the output control logic primitive OPR is at undefined level (FIG. 11).

That is, by the second response logic primitive RPR2, depending on the defined specified logic level (DINP, DINM)=(1, 1), (0, 0), (1, 0), (0, 1) of positive side logic input signal DINP and negative side logic input signal DINM, the output expectation signal OS realizing the truth table in FIG. 11 is generated. Depending on the detection of the defined logic level (DINP, DINM)=(0, 1), (1, 0), and output of second detection signal IS2 of low level by the second detection logic primitive DPR2, the output control logic primitive OPR issues the output expectation signal OS as output expectation value DOUT. Also depending on the detection of the defined logic level (DINP, DINM)=(1, 1), (0, 0), and output of second detection signal IS2 of high level by the second detection logic primitive DPR2, the output control logic primitive OPR issues the output expectation value DOUT of undefined level. Further depending on the detection of undefined logic level of at least either positive side logic input signal DINP or negative side logic input signal DINM, and output of second detection signal IS2 of undefined level by the second detection logic primitive DPR2, the output control logic primitive OPR issues the output expectation value DOUT of undefined level.

Hence, in the logic simulator using the logic description library 1e, an undefined signal can be issued when at least either positive side logic input signal DINP or negative side logic input signal DINM is at undefined level and an undefined level should be issued as output expectation value. Further, as shown in the truth table in FIG. 11, according to the operation realized herein, when both positive side logic input signal DINP and negative side logic input signal DINM are at low level, or both are at high level, the output expectation value DOUT is at undefined level. That is, in the logic simulator using the logic description library 1e, when simulating the test pattern, it hence avoids a problem of output of wrong defined output expectation value, instead of output of undefined signal as output signal.

By the logic description library 1e, in addition to the input and output response depending on the differential voltage between differential input signals of positive side logic input signal DINP and negative side logic input signal DINM, the input and output response can be correctly expressed depending on the voltage level of individual differential input signals. By the logic simulation using the logic description library 1e, in the test pattern generated by the test pattern generator, a correct output expectation value can be obtained in all combinations of differential input signals entered in the differential input circuit. A differential input circuit expressed by applying the logic description library 1e includes, for example, a differential input signal receiving a differential signal coinciding with the specification of the LVDS interface.

Figure 12:
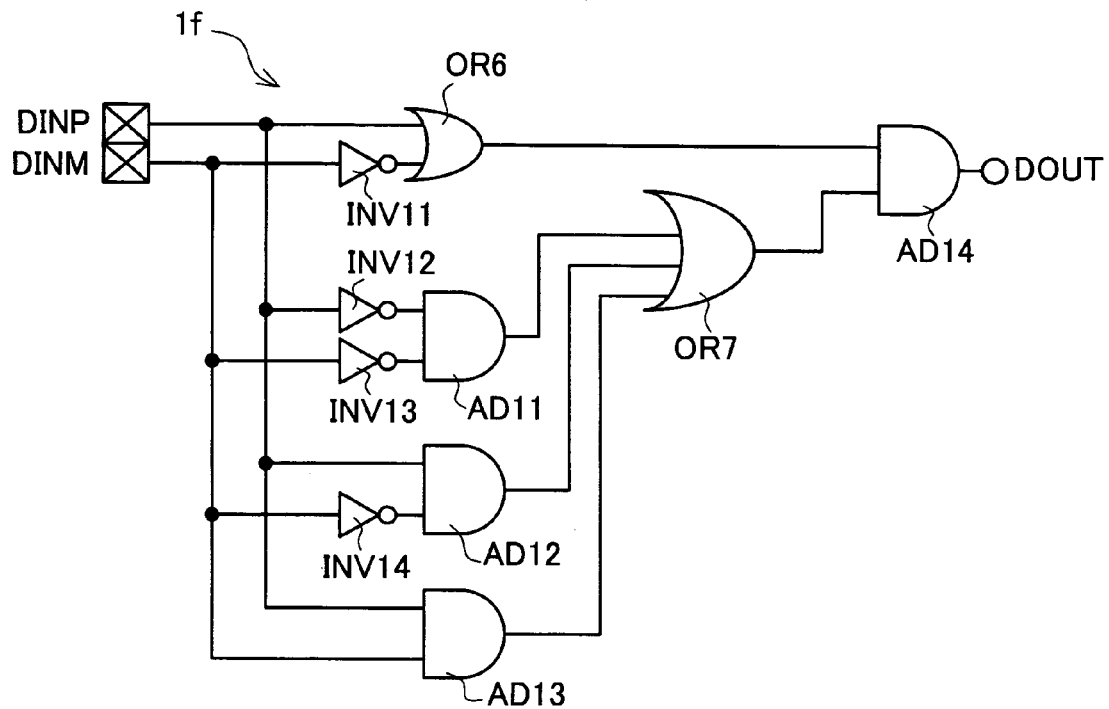
FIG. 12 is a logic description library 1f in a sixth preferred embodiment.
Figure 13:
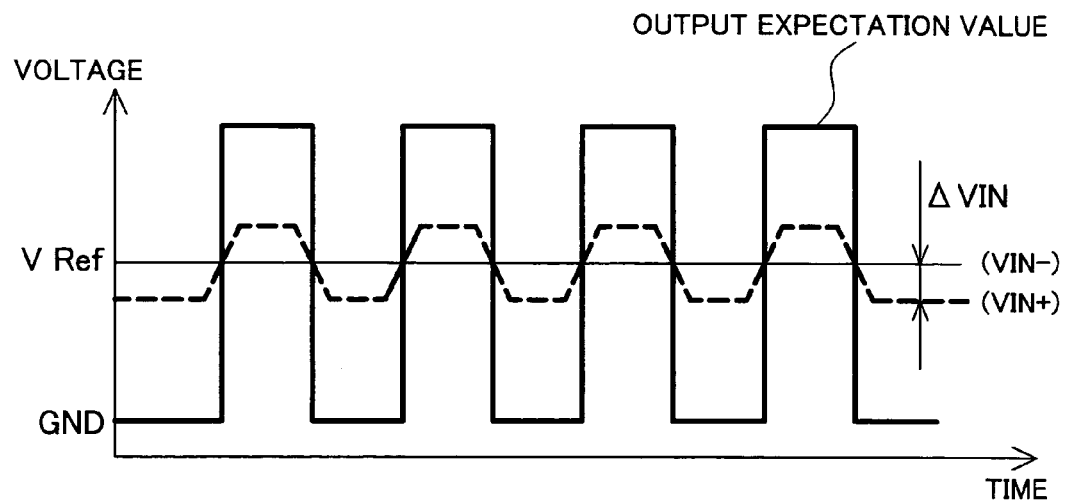
FIG. 13 is a diagram showing voltage application method when testing a differential input circuit in a prior art.
Figures 14, 15:
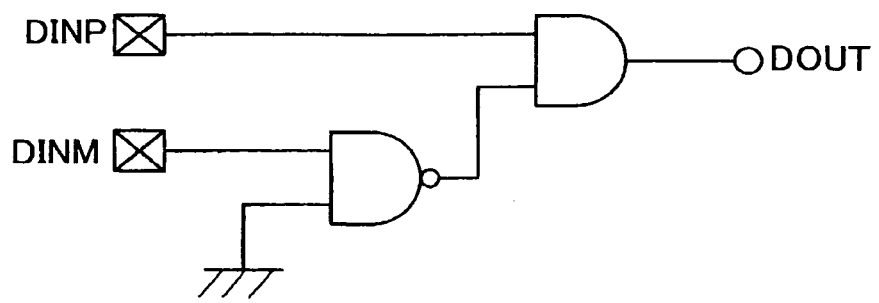
FIG. 14 is a logic description library of differential input circuit in the prior art.
FIG. 15 is a truth table of FIG. 14.

A logic description library 1f in a sixth preferred embodiment is shown in FIG. 12, and its truth table is shown in FIG. 5. The logic description library 1f is a logic description library issuing an undefined signal as output expectation value DOUT when at least either positive side logic input signal DINP or negative side logic input signal DINM is at undefined logic level. The logic description library 1f is also a logic description library in which output expectation value DOUT is at high level when both positive side logic input signal DINP and negative side logic input signal DINM are at low level, or both are at high level. The logic description library 1f is further a simplified logic description library capable of realizing the truth table in FIG. 5 same as in the logic description library 1b (FIG. 4), and omitting the tristate buffer TBF of the logic description library 1b.

The logic description library 1f comprises AND gates AD11 to AD14, inverters INV11 to INV14, and OR gates OR6 and OR7. Positive side logic input signal DINP is supplied into OR gate OR6 and AND gates AD12 and AD13, and is also supplied into AND gate AD11 by way of inverter INV12. Negative side logic input signal DINM is supplied into AND gate AD13, and is also supplied into OR gate OR6 and AND gates AD11 and AD12 by way of inverters INV11, INV13 and INV14 respectively. Outputs of AND gates AD11 to AD13 are both fed into OR gate OR7. Output of OR gates OR6 and OR7 are fed into AND gate AD14. From AND gate AD14, output expectation value DOUT is issued.

When both positive side logic input signal DINP and negative side logic input signal DINM are at low level, the operation is explained. The outputs of OR gate OR6 and AND gate AD11 are at high level. Since a high level signal is entered from the AND gate AD11, the output of OR gate OR 7 is defined at high level. Since high level signals are entered into AND gate AD14 from OR gates OR6 and OR7, the output expectation value DOUT is at high level (FIG. 5).

When both positive side logic input signal DINP and negative side logic input signal DINM are at high level, the operation is explained. The outputs of OR gate OR6 and AND gate AD13 are at high level. Since a high level signal is entered from the AND gate AD13, the output of OR gate OR 7 is defined at high level. Since high level signals are entered into AND gate AD14 from OR gates OR6 and OR7, the output expectation value DOUT is at high level (FIG. 5).

When positive side logic input signal DINP is at low level and negative side logic input signal DINM is at high level, the operation is explained. The outputs of OR gate OR6 and AND gates AD11 to AD13 are at low level. The output of OR gate OR 7 is defined at low level. Since low level signals are entered into AND gate AD14 from OR gates OR6 and OR7, the output expectation value DOUT is at low level (FIG. 5).

When positive side logic input signal DINP is at high level and negative side logic input signal DINM is at low level, the operation is explained. The outputs of OR gate OR6 and AND gate AD12 are at high level. Since a high level signal is entered from the AND gate AD12, the output of OR gate OR 7 is defined at high level. Since high level signals are entered into AND gate AD14 from OR gates OR6 and OR7, the output expectation value DOUT is at high level (FIG. 5).

When at least either positive side logic input signal DINP or negative side logic input signal DINM is at undefined level, the operation of the logic description library 1f is explained. First, suppose the positive side logic input signal DINP to be at low level and negative side logic input signal DINM to be at undefined level. The output signal of OR gate OR6 is at undefined level. Since a high level signal and undefined level signal are entered in the AND gate AD11, its output is at undefined level. The AND gates AD12 and AD13 receive positive side logic input signal DINP of low level, and their outputs are defined at low level. Hence undefined level and low level signals are entered in the OR gate OR7, the output of the OR gate OR7 is at undefined level. In the AND gate AD14, undefined level signals are entered from OR gates OR6 and OR7, and the output expectation value DOUT is at undefined level (FIG. 5).

When positive side logic input signal DINP is at high level and negative side logic input signal DINM is at undefined level, the operation is explained below. The output signal of OR gate OR6 is at high level. The output signal of AND gate AD11 is at low level. Since a high level signal and an undefined level signal are entered in the AND gates AD12 and AD13, both output signals are at undefined level. Hence the output of OR gate OR7 is at undefined level. In the AND gate AD14, a high level signal is entered from OR gate OR6 and an undefined level signal from OR gate OR7, and the output expectation value DOUT is at undefined level (FIG. 5).

When positive side logic input signal DINP is at undefined level and negative side logic input signal DINM is at low level, the operation is explained below. The output signal of OR gate OR6 is at high level. The output signal of AND gate AD13 is at low level. Since a high level signal and an undefined level signal are entered in the AND gates AD11 and AD12, both output signals are at undefined level. Hence the output of OR gate OR7 is at undefined level. In the AND gate AD14, a high level signal is entered from OR gate OR6 and an undefined level signal from OR gate OR7, and the output expectation value DOUT is at undefined level (FIG. 5).

When positive side logic input signal DINP is at undefined level and negative side logic input signal DINM is at high level, the operation is explained below. The output signal of OR gate OR6 is at undefined level. The output signals of AND gates AD11 and AD12 are at low level. Since a high level signal and an undefined level signal are entered in the AND gate AD13, the output signal is at undefined level. Hence the output of OR gate OR7 is at undefined level. In the AND gate AD14, undefined level signals are entered from OR gates OR6 and OR7, and the output expectation value DOUT is at undefined level (FIG. 5).

When both positive side logic input signal DINP and negative side logic input signal DINM are at undefined level, in the AND gate AD14, undefined level signals are entered from OR gates OR6 and OR7, and the output expectation value DOUT is at undefined level (FIG. 5).

Hence, in the logic simulator using the logic description library 1f, an undefined signal can be issued when at least either positive side logic input signal DINP or negative side logic input signal DINM is at undefined level and an undefined level should be issued as output expectation value. Further, as shown in the truth table in FIG. 5, when both positive side logic input signal DINP and negative side logic input signal DINM are at low level, the operation of output of output expectation value DOUT of high level can be realized in a simplified logic description library omitting the tristate buffer TBF as compared with the logic description library 1b (FIG. 4). That is, in the logic simulator using the logic description library 1f, when simulating the test pattern, it hence avoids a problem of output of wrong defined output expectation value, instead of output of undefined signal as output signal.

By the logic description library 1f, in addition to the input and output response depending on the differential voltage between differential input signals of positive side logic input signal DINP and negative side logic input signal DINM, the input and output response can be correctly expressed depending on the voltage level of individual differential input signals. By the logic simulation using the logic description library 1f, in the test pattern generated by the test pattern generator, a correct output expectation value can be obtained in all combinations of differential input signals entered in the differential input circuit.

The invention is not limited to these illustrated preferred embodiments alone, but it must be noted that it can be changed and modified in various manners within a scope not departing from the true spirit of the invention.

According to the invention, by composing the logic description library logically expressing the differential input circuit by the first logic primitive, in addition to the input and output response depending on the differential voltage between differential input signals, the input and output response can be correctly expressed depending on the voltage level of individual differential input signals. By the logic simulation using this logic description library, in the test pattern in all combinations of inputs in the differential input circuit, a correct output expectation value can be obtained.

What is claimed is:

1. A tangible computer readable medium encoded with a computer program, the program when executed by a computer causes the computer to execute:

expressing, with a logic description library that deals logic signals, an input and an output response of a differential input circuit, which receives analog differential input signals and outputs a high level output signal when a first input signal is higher than a second input signal and outputs a low level output signal when the first input signal is lower than the second input signal, so that the differential input signal is simulated by a logic simulator;

issuing a low level as the output expectation value when both of the received analog differential input signals are at a low level;

issuing a low level as the output expectation value when the first input signal is at the low level and the second input signal is at a high level;

issuing a high level as the output expectation value when the first input signal is at the high level and the second input signal is at the low level;

issuing a high level as the output expectation value when the first input signal is at the high level and the second input signal is at the high level;

issuing an undefined state as the output expectation value when the first input signal is in an undefined state and the second input signal is at the low level;

issuing an undefined state as the output expectation value when the first input signal is in the undefined state and the second input signal is at the high level;

issuing an undefined state as the output expectation value when the first input signal is at the low level and the second input signal is in the undefined state;

issuing an undefined state as the output expectation value when the first input signal is at the high level and the second input signal is in the undefined state;

issuing an undefined state as the output expectation value when the first input signal is in the undefined state and the second input signal is in the undefined state; and simulating the logic description library with the logic simulator.

2. The tangible computer readable medium according to of claim 1, wherein the program further causes the computer to execute:

detecting whether said either one of the received analog differential input signals is in the undefined state or a defined state, in case issuing an undefined state.

3. The tangible computer readable medium according to claim 1, wherein the program further causes the computer to execute:

issuing an undefined state as the output expectation value when it is determined that either one of the received analog differential input signals is in the undefined state.

4. The tangible computer readable medium according to claim 1, wherein the program further causes the computer to execute:

generating an output expectation signal associated with a specified input/output response of the differential input circuit, according to a defined logic level of the received analog differential input signals; and issuing the output expectation signal as the output expectation value when it is detected that the received analog differential input signal is in a defined state.

5. A tangible computer readable medium encoded with a computer program, the program when executed by a computer causes the computer to execute:

expressing, with a logic description library that deals logic signals, an input and an output response of a differential input circuit, which receives analog differential input signals and outputs a high level output signal when a first input signal is higher than a second input signal and outputs a low level output signal when the first input signal is lower than the second input signal, so that the differential input signal is simulated by a logic simulator;

issuing a high level as the output expectation value when both of the received analog differential input signals are at a low level;

issuing a high level as the output expectation value when both of the received analog differential input signals are at a high level;

issuing a low level as the output expectation value when the first input signal is at the low level and the second input signal is at the high level;

issuing a high level as the output expectation value when the first input signal is at the high level and the second input signal is at the low level;

issuing an undefined state as the output expectation value when the first input signal is in an undefined state and the second input signal is at the low level;

issuing an undefined state as the output expectation value when the first input signal is in the undefined state and the second input signal is at the high level;

issuing an undefined state as the output expectation value when the first input signal is at the low level and the second input signal is in the undefined state;

issuing an undefined state as the output expectation value when the first input signal is at the high level and the second input signal is in the undefined state;

issuing an undefined state as the output expectation value when the first input signal is in the undefined state and the second input signal is in the undefined state; and simulating the logic description library with the logic simulator.

6. The tangible computer readable medium according to claim 5, wherein the program further causes the computer to execute:
detecting whether said either one of the received analog differential input signals is in the undefined state or a defined state, in case issuing an undefined state.

7. The tangible computer readable medium according to claim 5, wherein the program further causes the computer to execute:
issuing an undefined state as the output expectation value when it is determined that either one of the received analog differential input signals is in the undefined state.

8. The tangible computer readable medium according to claim 5, wherein the program further causes the computer to execute:
generating an output expectation signal associated with a specified input/output response of the differential input circuit, according to a defined logic level of the received analog differential input signals, and
issuing the output expectation signal as the output expectation value when it is detected that the received analog differential input signal is in a defined state.

9. A tangible computer readable medium encoded with a computer program, the program when executed by a computer causes the computer to execute:
issuing an undefined state as the output expectation value when both of the received analog differential input signals are at a low level;
issuing an undefined state as the output expectation value when both of the received analog differential input signals are at a high level;
issuing a low level as the output expectation value when the first input signal is at the low level and the second input signal is at the high level;
issuing a high level as the output expectation value when the first input signal is at the high level and the second input signal is at the low level;
issuing an undefined state as the output expectation value when the first input signal is in an undefined state and the second input signal is at the low level;
issuing an undefined state as the output expectation value when the first input signal is in the undefined state and the second input signal is at the high level;
issuing an undefined state as the output expectation value when the first input signal is at the low level and the second input signal is in the undefined state;
issuing an undefined state as the output expectation value when the first input signal is at the high level and the second input signal is in the undefined state;
issuing an undefined state as the output expectation value when the first input signal is in the undefined state and the second input signal is in the undefined state; and
simulating the logic description library with the logic simulator.

10. The tangible computer readable medium according to claim 9, wherein the program further causes the computer to execute:
detecting whether said either one of the received analog differential input signals is in the undefined state or a defined state, in case issuing an undefined state.

11. The tangible computer readable medium according to claim 9, wherein the program further causes the computer to execute:
issuing an undefined state as the output expectation value when it is determined that either one of the received analog differential input signals is in the undefined state.

12. The tangible computer readable medium according to claim 9, wherein the program further causes the computer to execute:
generating an output expectation signal associated with a specified input/output response of the differential input circuit, according to a defined logic level of the received analog differential input signals, and
issuing the output expectation signal as the output expectation value when it is detected that the received analog differential input signal is in a defined state.

13. A tangible computer readable medium encoded with a computer program, the program when executed by a computer causes the computer to execute:
issuing a low level as the output expectation value when both of the received analog differential input signals are at a high level;
issuing a low level as the output expectation value when both of the received analog differential input signals are at a low level;
issuing a low level as the output expectation value when the first input signal is at the low level and the second input signal is at the high level;
issuing a high level as the output expectation value when the first input signal is at the high level and the second input signal is at the low level;
issuing an undefined state as the output expectation value when the first input signal is in an undefined state and the second input signal is at the low level;
issuing an undefined state as the output expectation value when the first input signal is in the undefined state and the second input signal is at the high level;
issuing an undefined state as the output expectation value when the first input signal is at the low level and the second input signal is in the undefined state;
issuing an undefined state as the output expectation value when the first input signal is at the high level and the second input signal is in the undefined state;
issuing an undefined state as the output expectation value when the first input signal is in the undefined state and the second input signal is in the undefined state; and
simulating the logic description library with the logic simulator.

14. The tangible computer readable medium according to claim 13, wherein the program further causes the computer to execute:
detecting whether said either one of the received analog differential input signals is in the undefined state or a defined state, in case issuing an undefined state.

15. The tangible computer readable medium according to claim 13, wherein the program further causes the computer to execute:
issuing an undefined state as the output expectation value when it is determined that either one of the received analog differential input signals is in the undefined state.

16. The tangible computer readable medium according to claim 13, wherein the program further causes the computer to execute:
generating an output expectation signal associated with a specified input/output response of the differential input circuit, according to a defined logic level of the received analog differential input signals, and
issuing the output expectation signal as the output expectation value when it is detected that the received analog differential input signal is in a defined state.

* * * * *

UNITED STATES PATENT AND TRADEMARK OFFICE
CERTIFICATE OF CORRECTION

| | | |
|---|---|---|
| PATENT NO. | : 7,757,199 B2 | |
| APPLICATION NO. | : 10/986146 | |
| DATED | : July 13, 2010 | |
| INVENTOR(S) | : Hiroshi Miyazaki | |

It is certified that error appears in the above-identified patent and that said Letters Patent is hereby corrected as shown below:

Column 18, Line 6 in Claim 2, after "to" delete "of".

Signed and Sealed this
Twenty-eighth Day of December, 2010

David J. Kappos
*Director of the United States Patent and Trademark Office*